(12) United States Patent
Whitmire et al.

(10) Patent No.: US 6,313,751 B1
(45) Date of Patent: *Nov. 6, 2001

(54) BATTERY FAILURE INDICATOR FOR A SINGLE BATTERY

(75) Inventors: Warren T. Whitmire, Shalimar; David J. Ault, Fort Walton Beach, both of FL (US)

(73) Assignee: Batcon, Inc., Fort Walton Beach, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/609,634

(22) Filed: Jul. 3, 2000

Related U.S. Application Data

(63) Continuation-in-part of application No. 09/179,282, filed on Oct. 26, 1998, now Pat. No. 6,140,927, which is a continuation-in-part of application No. 08/758,843, filed on Dec. 2, 1996, now abandoned.

(51) Int. Cl.[7] .................................................... G08B 21/00
(52) U.S. Cl. ......................... 340/636; 340/635; 324/433; 324/434; 320/116; 320/126; 320/112; 320/FOR 106; 320/FOR 147; 320/DIG. 13; 320/DIG. 18; 320/DIG. 21
(58) Field of Search ..................... 340/636, 635; 324/433, 434; 320/126, 116, 112, FOR 106, FOR 115, FOR 147, DIG. 13, DIG. 18, DIG. 21

(56) References Cited

U.S. PATENT DOCUMENTS

| 4,424,491 | * | 1/1984 | Bobbett et al. | 324/433 |
| 5,027,294 | * | 6/1991 | Fakruddin et al. | 364/550 |
| 5,302,902 | * | 4/1994 | Groehl | 324/434 |
| 5,675,234 | * | 10/1997 | Greene | 320/15 |
| 5,751,217 | * | 5/1998 | Kchao et al. | 340/636 |
| 5,841,357 | * | 11/1998 | Henry et al. | 340/636 |
| 6,140,927 | * | 10/2000 | Whitmire | 340/636 |

* cited by examiner

*Primary Examiner*—Julie Lieu
(74) *Attorney, Agent, or Firm*—Batcon, Inc.

(57) ABSTRACT

A modification to existing mono-block battery design for positively indicating the operating condition of the battery by adding a failure detector. The voltage of two groups of internal series connected cells are measured and compared. An indicator of one color indicates the battery is operating normally and an indicator of a contrasting color indicates the battery is defective. The indicator may be located remotely from the failure detector. An additional embodiment provides for an optical indicator located remotely from the failure detector such that luminous energy is transferred from the failure detector to the remote indicator by an optical-conductor.

3 Claims, 7 Drawing Sheets

BATTERY FAILURE INDICATOR FOR A SINGLE BATTERY

CROSS-REFERENCE TO RELATED APPLICATIONS

This is a continuation-in-part of U. S. patent application No. 09/179,282 filed Oct. 26, 1998, now U.S. Pat. No. 6,140,927, which is a continuation-in-part of U.S. patent application Ser. No. 08/758,843 filed Dec. 2, 1996 now abandoned.

New matter related to the continuation-in-part is appended after the original matter in each respective section of the specification.

BACKGROUND OF THE INVENTION

Another object of this invention is to provide a means of remotely indicating battery condition.

Another object of the invention is to provide a bi-directional communication means for transferring data and instructions.

PRIOR ART

Some lead-acid battery manufacturers use visible warning indicators to show a battery may be discharged or defective. The indicators are only responsive to one cell in the battery and the viewer must be near the battery. Many times the battery is in an in-accessible location, such as under an automobile seat or in a remotely located battery room. The present invention provides for several novel methods to convey battery condition information to a suitable convenient location.

SUMMARY OF THE INVENTION

Additional embodiments of the present invention provide methods for communicating the battery condition. A failure indicator may be located remotely from the battery monitor in proximity of an observer. Information representing the battery condition may be communicated by simple serial data interfaces, or a variety of information networks known to those in the art such as SAE J-1739, SAE J-1750 or J-1850.

DETAILED DESCRIPTION OF THE PREFERRED EMBODIMENTS

Most lead acid batteries are now manufactured as sealed units, which permits placement in locations that are not readily accessible for maintenance. Batteries that are out of sight and out of mind are more likely to be neglected. A battery failure detector with remote indication and/or communication capability is extremely useful in warning of pending failure.

Figure 1:
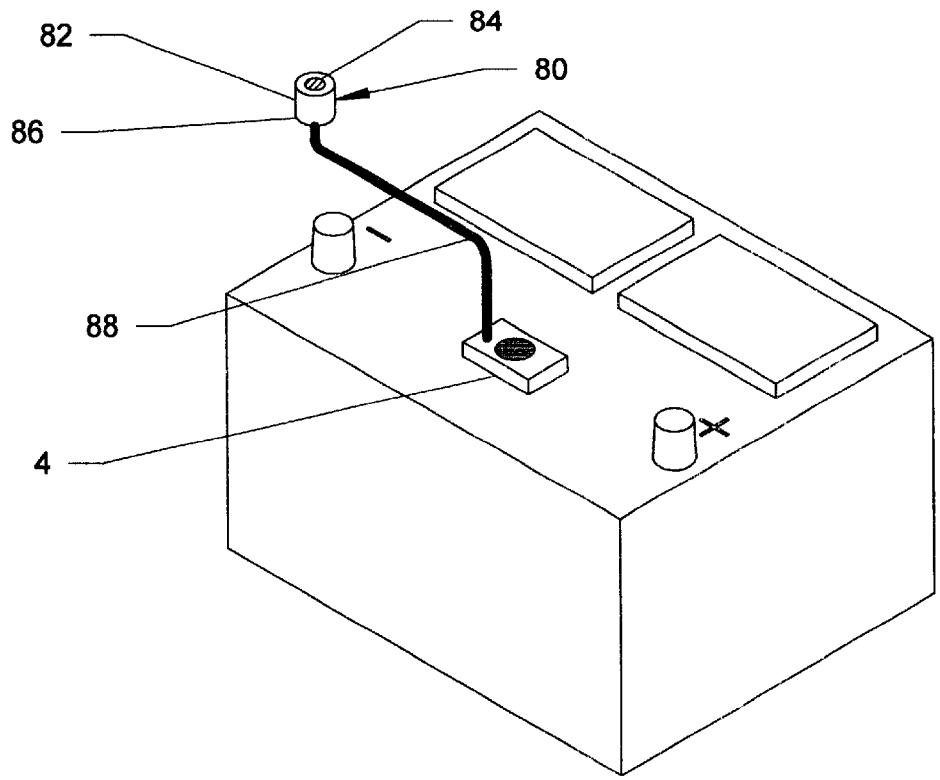
FIG. 1 is an isometric view of the battery failure indicator with a remote indicator.

FIG. 1 shows a second embodiment of the present invention with a novel remedy for this situation. A remote indicator 80 consists of a body 82, face 84 and an electrical cable 88 containing one or more wires and a variety of indicator elements. The remote indicator 80 may be located a substantial distance from the failure detector 4 for convenient observation.

A battery fault condition will be defined to simplify discussion in the embodiments that follow. Refer to page 5 paragraph 2 of the specification Ser. No. 09/179,282, a battery fault condition is true when the any of the values VD1 . . . VD6 are less than 0 volts as determined by the microprocessor program, else the battery fault condition is false.

Figure 3:
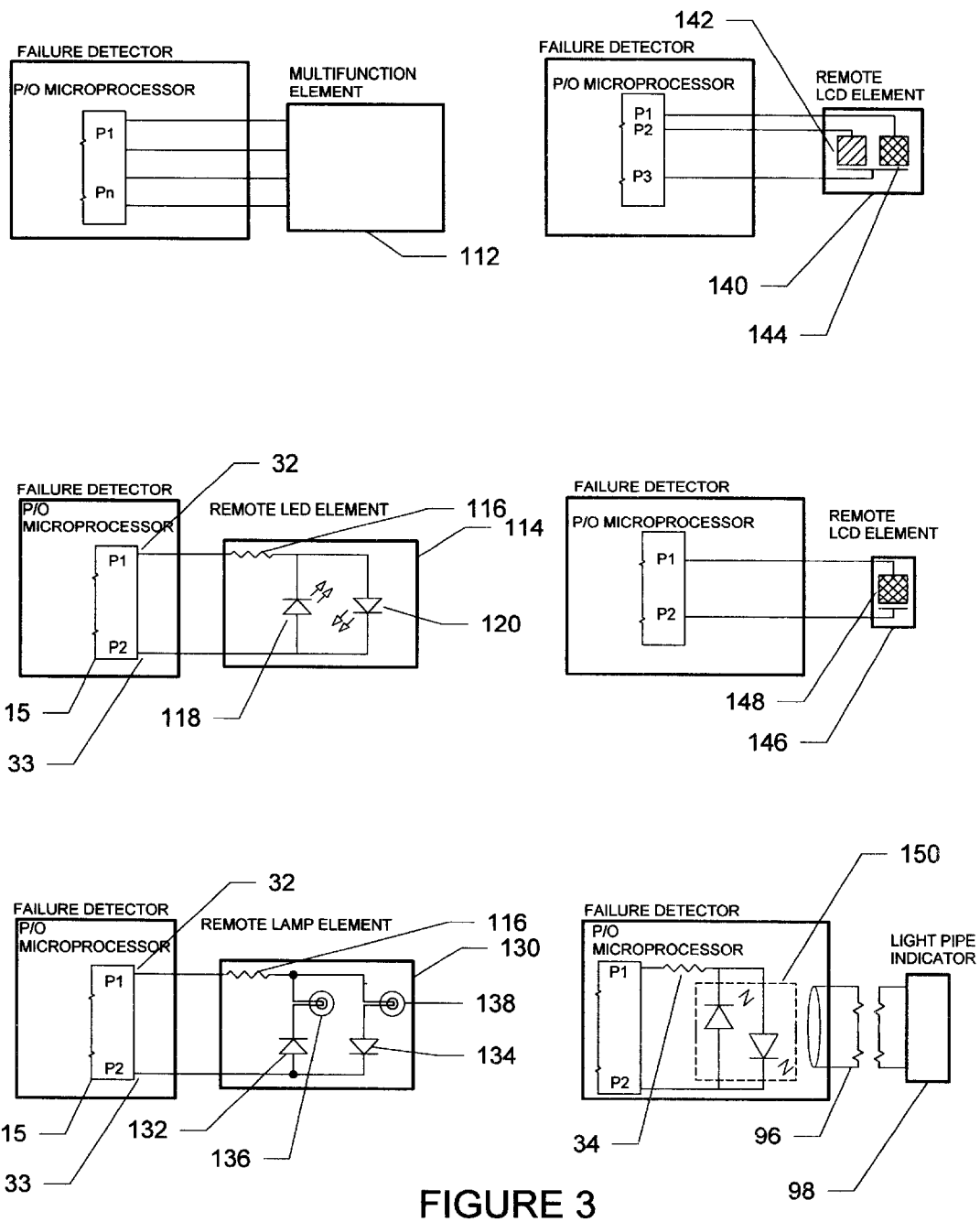
FIG. 3 shows block diagrams of the various indicator elements within a remote indicator.
Figure 4:
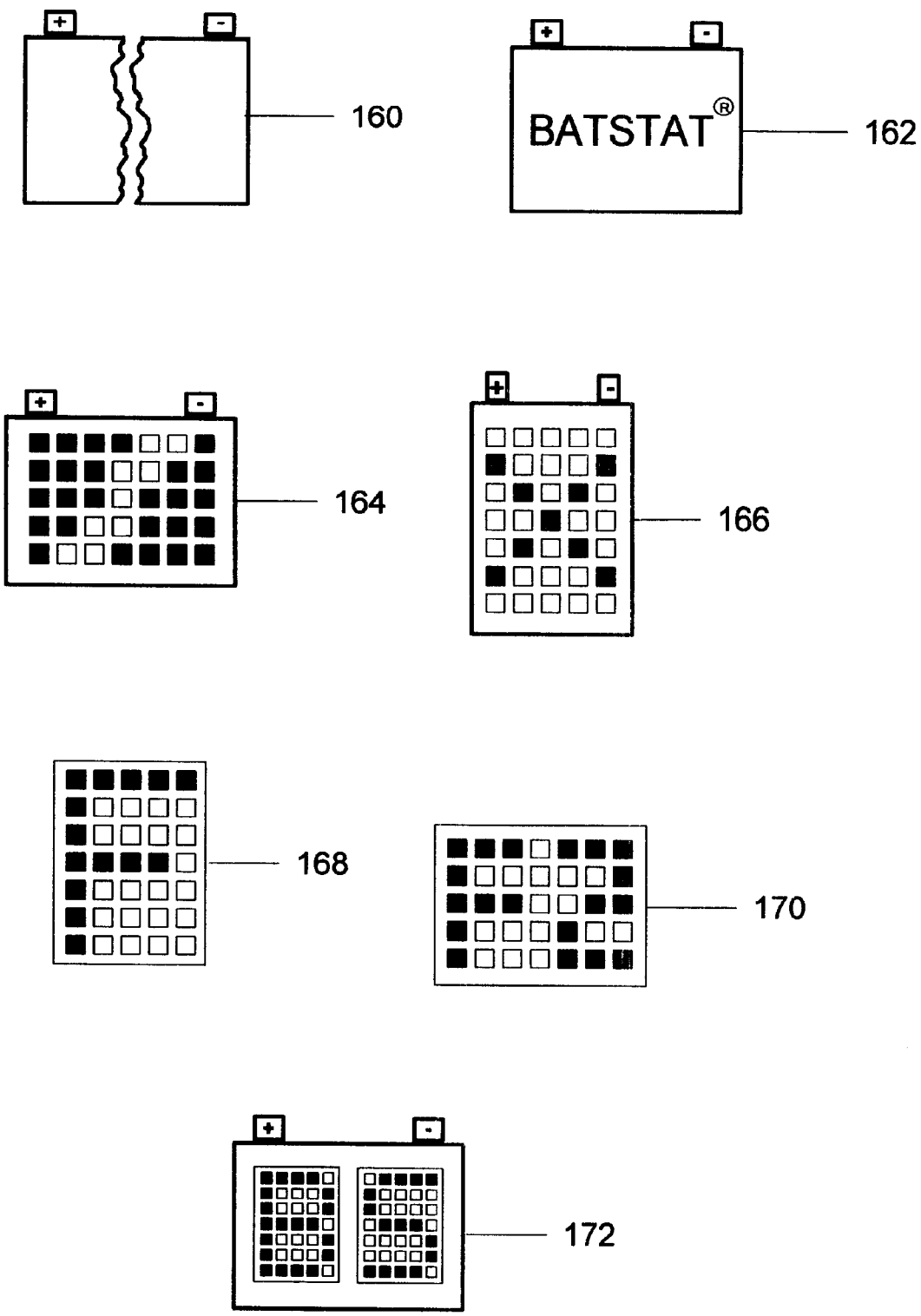
FIG. 4 shows various display patterns and legends representing various battery conditions that are own on the rote indicator.

The remote indicator 80 may be implemented with a variety of indicator elements. The most preferred indicator elements are shown in FIG. 3. The face 84 is normally transparent for direct viewing of the indicator element; however, a simple and effective message about the battery condition is displayed on a face with a pattern indicating a particular battery condition as determined by the failure detector 4. The patterns and legends in FIG. 4 are illuminated by the LEDs 118, 120, or lamps 136, 138 within the remote indicator. A first such pattern, the broken battery 160, is visible by illuminating lamp 136 when the battery fault condition is true. A second such pattern is a battery with the BATSTAT™ logo 162 that is visible when illuminated by lamp 136 when the battery fault condition is false. Patterns 164, 166, 168, and 170 are visible when a dot matrix LED or LCD devices is used to indicate that the battery fault condition is true. Pattern 172 is a pattern that is visible when dot matrix LED or LCD device is used to indicate that the battery fault condition is false.

A first type of indicator element within the remote indicator is shown in FIG. 3. The multi-function element 112 controls one or more display sub-elements and communicates with the failure detector via one or more ports on the microprocessor 15. Methods for communicating and controlling a device such as the multi-function element from a microprocessor and construction of the remote intelligent indicator are known to one skilled in the art.

A second type of indicator element consists of LED 118, LED 120 and resistor 116. The anode of LED 120 and cathode of LED 118 are connected to one end of resistor 116 and the other end of resistor 116 is connected to port P1 32 on the microprocessor 15 by a first wire. The cathode of LED 120 and the anode of LED 118 are connected to port P2 33 by a second wire. LED 120 is illuminated when the battery fault condition is false by setting microprocessor port P1 to a high value and simultaneously setting port P2 low value. LED 118 is illuminated when the battery fault condition is true by setting microprocessor port P2 to a high value and simultaneously setting port P1 low value. When either port P1 32 or P2 33 is off or if the voltage on both ports is approximately the same then both LEDs 118 and 120 are off. Resistor 116 is required to limit current in the LED.

Either LED 118 or 120 may be operated independently. For example LED 118 could be illuminated to signify the battery fault condition is false and extinguished when a battery fault condition is true. Conversely, the LED 120 could be illuminated when the battery fault condition is true and extinguished when the battery fault condition is false.

When a single LED, for example LED 118, is operated independently various patterns could be used in place of steady illumination. An LED consumes a relatively large amount of power when driven at the high currents required for viewing in high ambient light conditions. Operating the LED with a pattern at a low duty cycle permits a substantial power saving while at the same time attracting visual attention from the observer. For example, LED 118 could be flashed by illuminating for 200 mili-seconds then extinguishing for 800 mili-seconds. Only 25% of the power of a continuously illuminated LED is consumed.

Specifically the LED is flashed with a color signifying the battery fault condition is false such as green or blue. The LED could also be flashed with a color signifying the battery fault condition is true such as red or yellow.

A third type of indicator element consisting of lamp 136, lamp 138, diode 118, diode 120 and resistor 34 is shown in FIG. 3. Normally three wires would be required to selectively illuminate a single lamp, but one wire can be eliminated by using diodes 132 and 134 to steer current to lamp 136 or lamp 138 respectively. Lamp 138 is illuminated when the battery fault condition is false; lamp 136 is illuminated when the battery fault condition is true. Lamp 138 is illuminated by setting port P1 to a high value (near Vcc) and simultaneously setting port P2 33 to a low value (near 0 volts). Current will Pow from port P1 32 through resistor 116, lamp 138 and diode 134, then into port P2 33 causing the LAMP 138 to illuminate. Lamp 136 is illuminated by setting port P1 32 to a low value (near 0 volts) and simultaneously setting port P2 to a high value (near Vcc). Current will flow from port P2 33 through diode 132, lamp 136, resistor 116, then into port P1 32 causing LAMP 136 to illuminate. Resistor 116 is required to limit inrush current when the lamp starts to illuminate.

A fourth type of the remote indicator element consists of a single LCD 146 and connections to the microprocessor ports P1 32 and P2 33 for operating the LCD. Methods for connecting and controlling a LCD are known to those in the art. The LCD is driven by the microprocessor to indicate a first color or pattern the battery failure condition is false and indicates a second color or pattern when the battery failure condition is true. LCDs with this property are known to those in the art. This principle can be extended to multiple LCDs as shown by the multi-element LCD.

Figure 2:
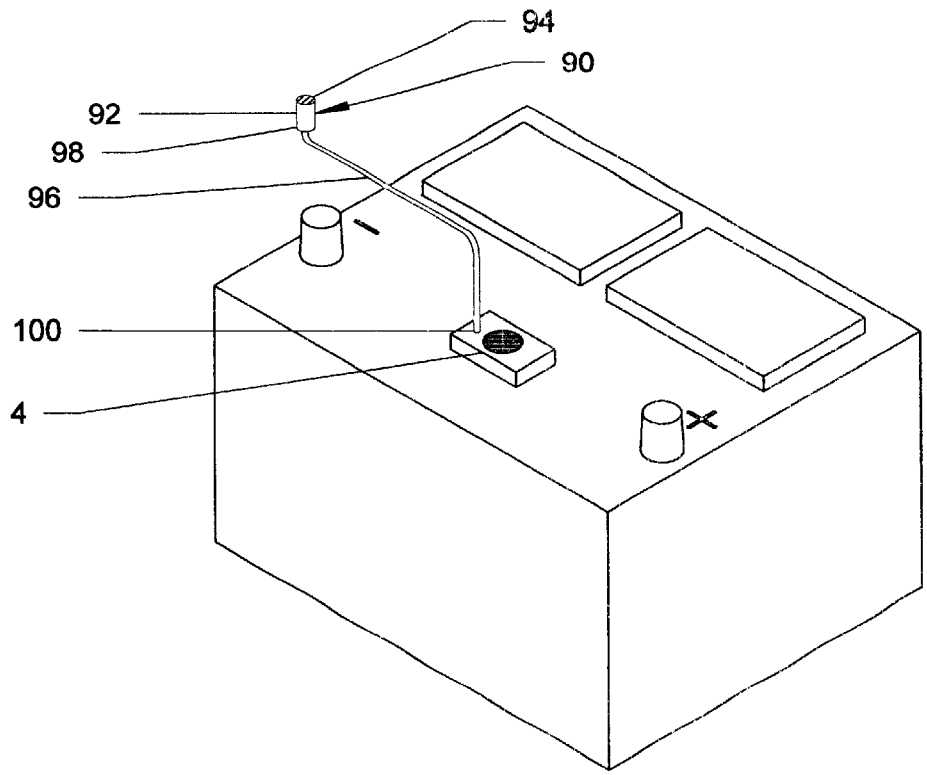
FIG. 2 is an isometric view of the failure detector connected to a remote indicator via an optical cable.

A third embodiment of the present invention is an remote optical indicator 90 shown in FIG. 2 consisting of a body 92, optical pipe diffuser 94 and an optical cable 96. The first end of the optical cable 98 is attached the diffuser 94 within the indicator, and the second end 100 of the optical cable is attached to the failure detector in close proximity to the multi color LED 150 shown in FIG. 3. Methods for attaching optical cables for illumination purposes are known to those in the art. A multi-colored LED 150 consists of two or more single color LEDs in one package that may be independently controlled. The optical energy from the multi-LED 150 representing a battery fault condition that is true or false is conducted to the face of the indicator by means of the optical cable and a light pipe.

Figure 5:
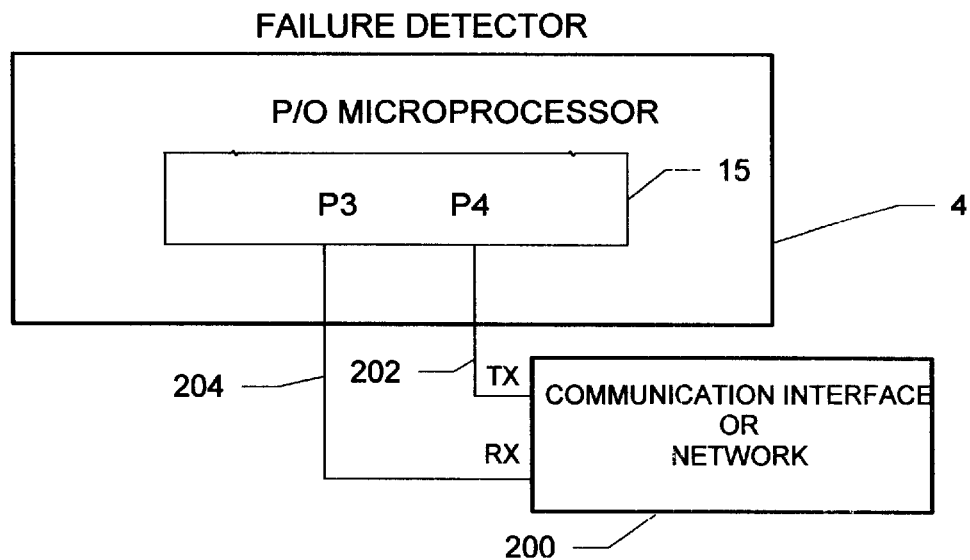
FIG. 5 and FIG. 6 are block diagrams showing two battery failure detectors, one with a serial communication interface and one with an isolated serial communication interface.

A fourth embodiment of the present invention is shown in FIG. 5. The battery fault condition information from the failure detector is communicated to other devices such as instrumentation systems, computers or data link devices by means of standard networks. FIG. 5 shows a block diagram of a communication network 200 with a transmit circuit 202 and a receive circuit 204 connected to the microprocessor 15 within the failure detector 4.

Figure 6:
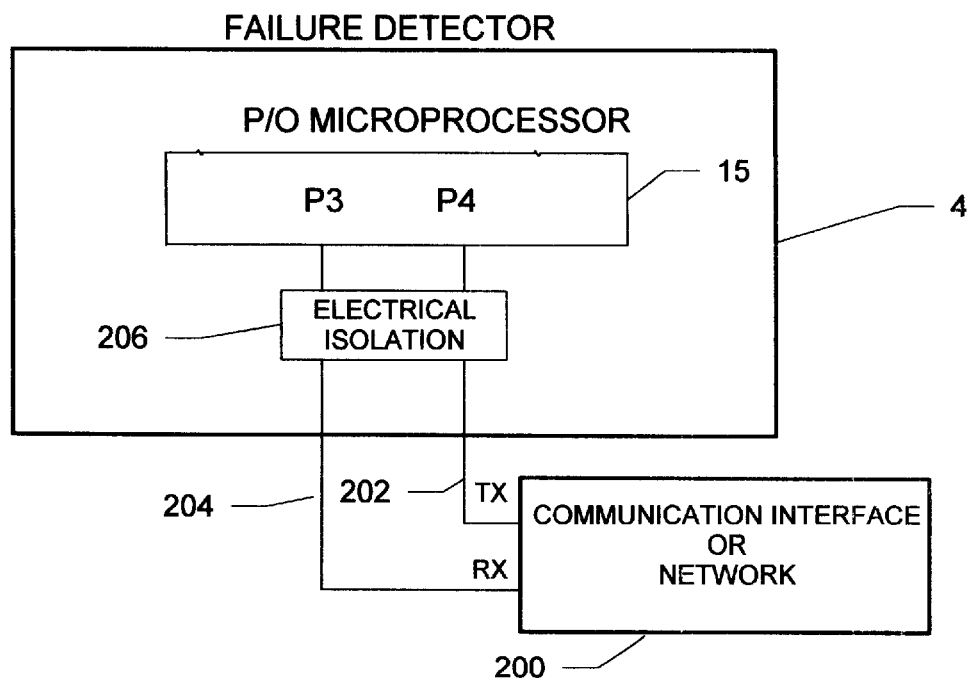

When more than one battery with the present invention is connected to a communication network, electrical isolation must be provided for proper network operation. FIG. 6 shows a block diagram of a communication network 200 with a transmit circuit 202 and a receive circuit 204 connected to the microprocessor 15 within the failure detector 4 by means of an electrical isolation device 206.

Figure 7:
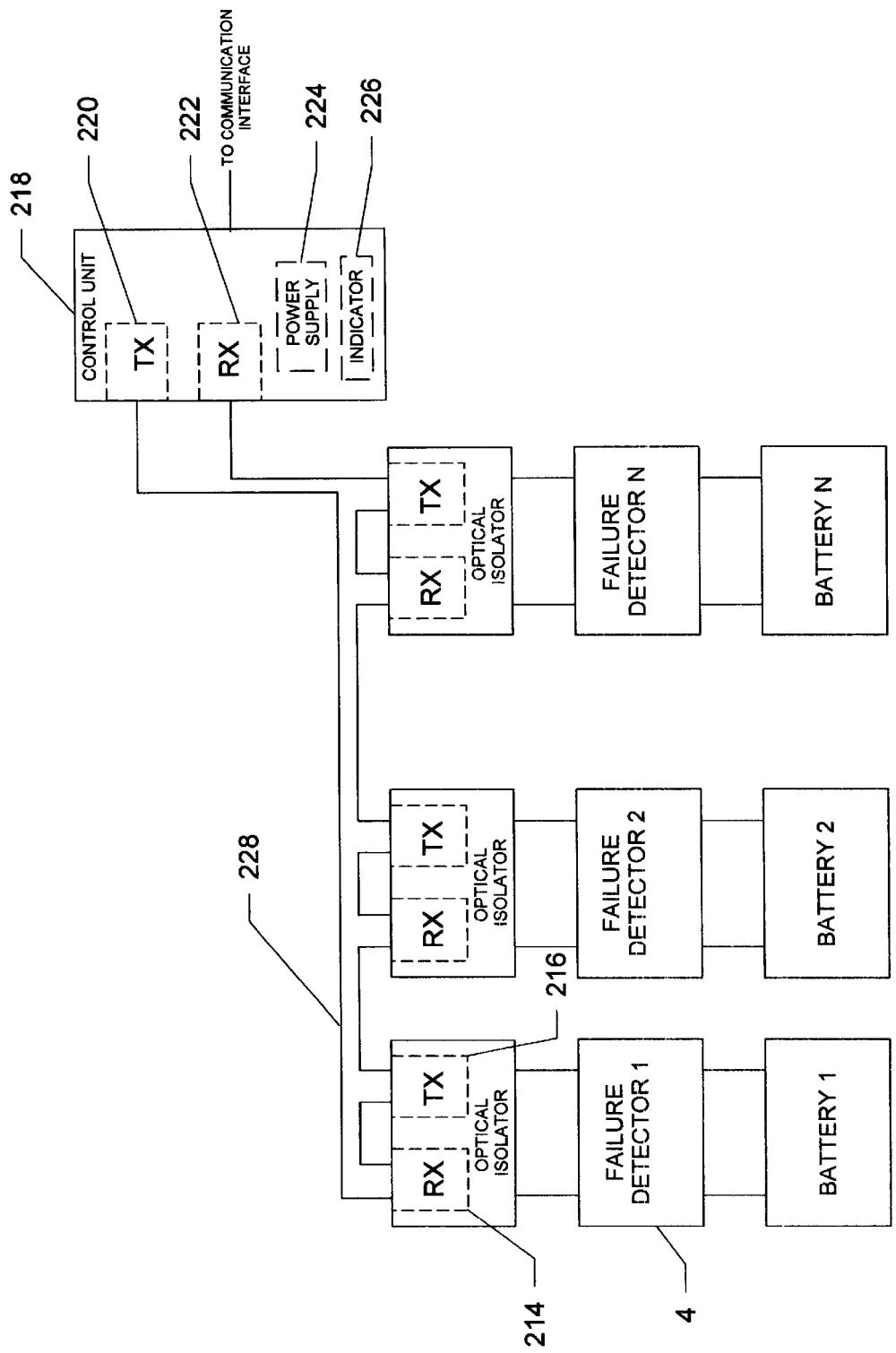
FIG. 7 is a block diagram showing multiple battery failure detectors connected to a remote control unit by means of an isolated half duplex current loop interface.
Figure 8:
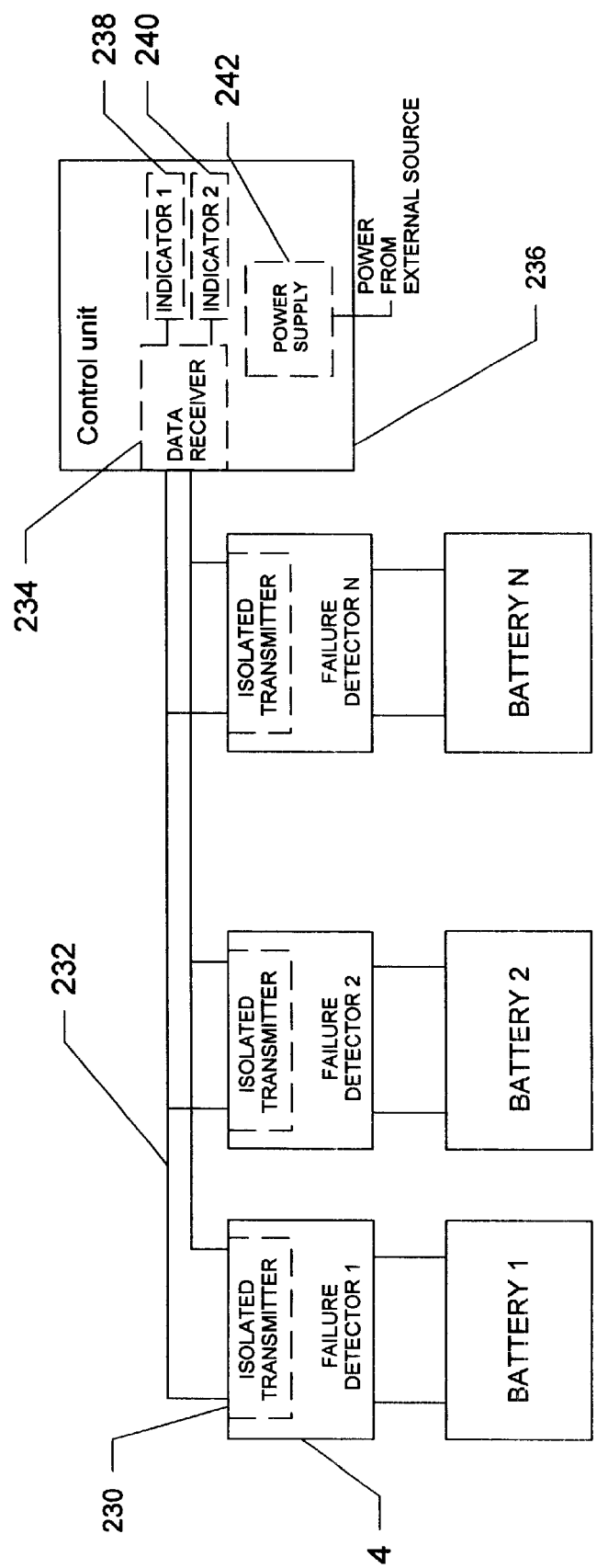
FIG. 8 shows multiple battery failure detectors with isolated transmitters on a common bus communication network.

Literature available to one in the art shows many methods of communicating by way of isolated interfaces and bus networks. FIGS. 7, and 8 show preferred methods of connecting the failure detector to a communication interface or to a single control unit. The communication interface is any one of many standard networks or data links common in the industry. Examples of the more popular interface standards that apply to a battery failure detector are Current Loop, RS-232, RS-485, SAE J-1708, SAE J-1850 and CAN. The control unit in FIGS. 7, 8 is a generic device that one skilled in the art could readily fabricate.

FIG. 7 is a block diagram of multiple batteries that may be connected in any series or parallel fashion. In a series connection, the potential at the positive post of battery n is greater than the potential at the positive post of battery 1 with respect to the negative terminal of battery 1. In practice the potential difference between the negative terminal of battery 1 and the positive terminal of battery n is normally 48V for telephone systems and may be 120V to 300V in other applications. This arrangement requires an electrically isolated data interface for proper operation of the data network. The operation of the failure detector associated with battery 1 will be described although the failure detector associated with battery 2—battery n is the same.

The failure detector 4 communicates the battery failure condition by means of a transmitter 216 and receiver 214 to a control unit 218. The transmitter 220 in the control unit provides current to the half duplex current loop network 228 which is received by each transmitter 216 and receiver 214. The transmitter and receiver are optically isolated devices known to those in the art. Any transmitter on the network can modulate current for transmitting information and any receiver on the network can receive the current. One skilled in the art would know the construction of such a network. The control unit 218 contains a power supply 224 for the circuits within the control unit and an indicator 226. The indicator 226 displays battery fault condition of any battery as determined by failure detector 1 through n and communicated by way of the network 228. The indicator 226 contains any of the indicator elements described in previous embodiments of the present invention as shown in FIGS. 3 and 4.

FIG. 8 shows one or more batteries with respective failure detectors configured to transmit a signal representing a battery fault condition to the control unit. Failure detector 14 determines that a fault condition is true for battery 1. When the fault condition is true, the isolated transmitter 230 is energized which creates a closed circuit path within the isolated transmitter causing current to flow in the interface circuit 232. The flow of current in the interface circuit 232 is detected by the receiver 234 in the control unit 236. Indicator 238 illuminates or displays a pattern representing a true battery fault condition. Indicator 2 240 illuminates or displays patterns representing a false battery fault condition when a flow of current is not detected by the receiver.

Indicators 238 and 240 contain any of the indicator elements described in previous embodiments of the present invention as shown in FIGS. 3 and 4.

Figure 9:
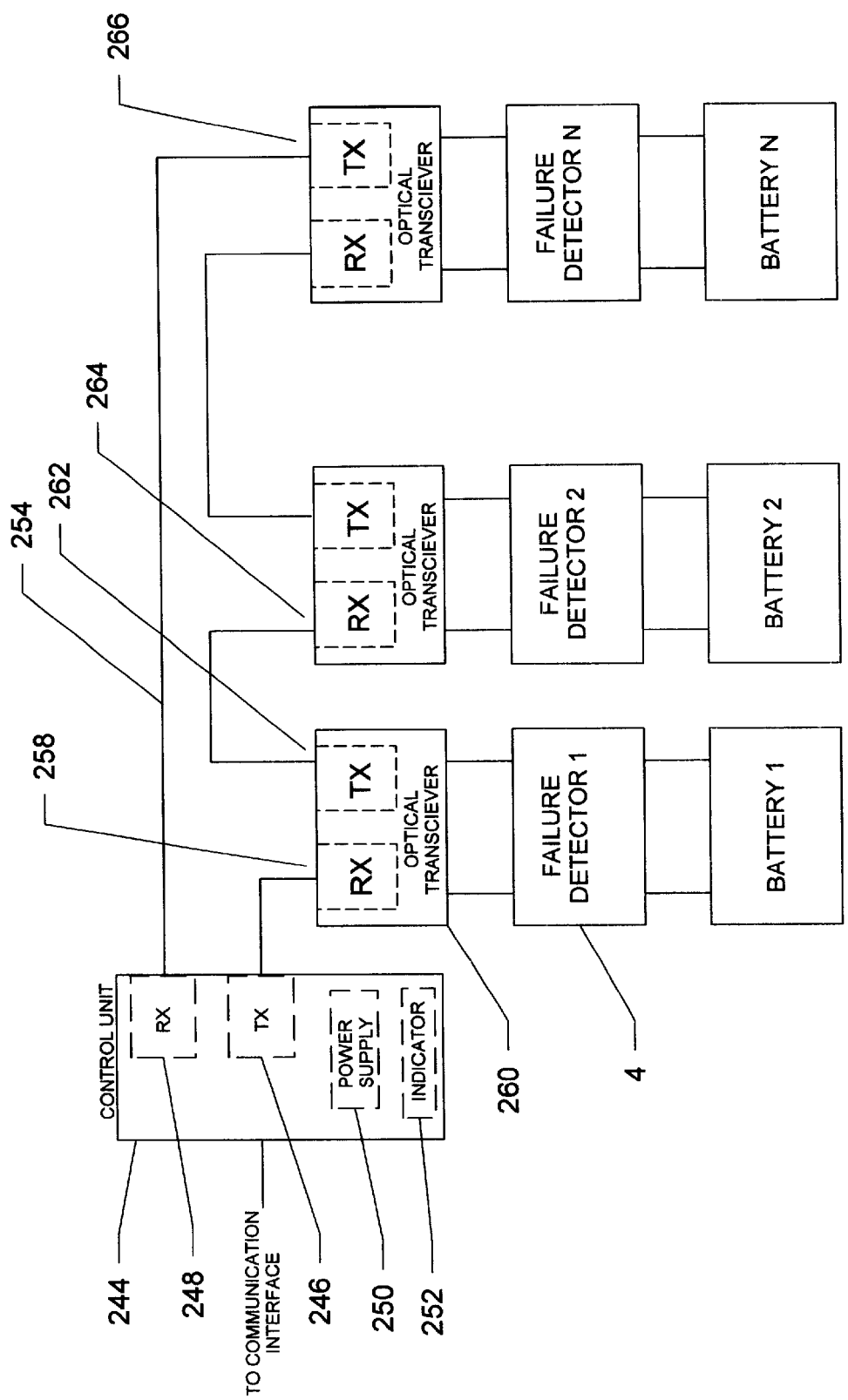
FIG. 9 shows multiple failure detectors connected to an isolated communication network by optical cables.

FIG. 9 shows another type of isolated communication network whereby one or more failure detectors communicate with a control unit by means of an optical cable. The optical cable operates in simplex mode, which requires each optical transceiver to be connected in series so that the optical cable and each transceiver forms a closed ring for data transmission. The transmitter 246 in the control unit 244 is connected to the receiver 258 of the first transceiver 260, the transmitter of the first transceiver 262 is connected to the receiver 264 of the next transceiver in a serial manner then the transmitter of the last transceiver 266 is connected to the receiver 248 of the control unit.

The battery fault condition information from failure detector 4 is sent to the transmitter section of optical transceiver 260 for transmission to the optical receiver 248 in the control unit 244 by means of the optical network 254. The indicator 252 displays a pattern representative of the battery fault condition information received by the receiver 248. Methods of sending data on an optical cable in the manner described are known to those in the art. The control unit 244 contains a power supply 250 for operating the circuits within.

While the invention has been shown with specific embodiments for the purpose of clear and concise, disclosure one skilled in the art could make modifications within the basic teachings of the invention. For example, the LCD elements in FIG. 3 could be varied in size, shape, color and legend depending on the market requirements. In FIGS. 6, 7, 8 and 9 several industry standard network interfaces are shown. A multitude of different protocols could be implemented with the optical networks shown. The control unit shown in different forms could contain additional communication processors and related circuits to enable communication with a variety of devices. In many instances, the functions of the control units shown exist in other equipment and the networks 228, 232, 254 can be directly connected.

We claim:

1. A system for monitoring the condition of a single electrical battery and providing warning of possible battery failure, said system comprising:

means for penetrating the exterior enclosure of said battery so as to connect electrical wires to the internal battery electrical conductors, means for connecting a plurality of said internal battery conductors to said monitoring system, means for detecting the difference in the magnitude of the voltage of a first group of cells in said battery and a second group of cells in said battery, said voltage difference detecting means comprising a multiplicity of voltage dividers, each of said voltage dividers connected between at least one cell of said electrical battery and one input of a multiple input analog to digital converter; a microprocessor; a power conditioning system; and an operating program, said microprocessor containing means for communication with said digital to analog converter, said operating program containing instructions executed in said microprocessor, and said instructions containing algorithms for commanding said analog to digital converter to detect voltage potential to every other said voltage potential and determine if the result of said comparisons is less than zero, whereby the condition of said single electrical battery is monitored and a warning of possible battery failure is provided;

means responsive to said detecting means for indicating the condition of said battery, said battery condition indicating means always indicating a first color when battery conditions as at an acceptable working potential, and a second color when battery condition is at an unacceptable working potential, said battery condition indicating means begin active with either a said first color or a said second color displayed and means for attaching said monitoring system to said exterior enclosure of said battery;

means for locating the said indicating means remotely from the said detector means, the said indicating means is connected to the said detector means with at least two wires providing current in a first direction when the said first color is active or in a second direction when the said second color is active.

2. The monitoring system of claim 1 with additional elements comprising:

an optical indicating means located remotely from said detector means, and an optical conductor for transferring light from the said indicating means within the said detector means to the said optical indicator such that the luminous energy from the said detector is visible at a location remote from the said detector means.

3. A system for monitoring the condition of a single electrical battery and providing warning of possible battery failure, said system comprising:

means for penetrating the exterior enclosure of said battery so as to connect electrical wires to the internal battery electrical conductors, means for connecting a plurality of said internal battery conductors to said monitoring system, means for detecting the difference in the magnitude of the voltage of a first group of cells in said battery and a second group of cells in said battery, said voltage difference detecting means comprising a multiplicity of voltage dividers, each of said voltage dividers connected between at least one cell of said electrical battery and one input of a multiple input analog to digital converter; a microprocessor; a power conditioning system; and an operating program, said microprocessor containing means for communication with said digital to analog converter, said operating program containing instructions executed in said microprocessor, and said instructions containing algorithms for commanding said analog to digital converter to detect voltage potential to every other said voltage potential and determine if the result of said comparisons is less than zero, whereby the condition of said single electrical battery is monitored and a warning of possible battery failure is provided;

optical communication means for transmitting status information from said detecting means to a remote optical receiving device, said optical communication means responsive to said detecting means by transmitting a first status coding when the battery condition is at an acceptable working potential, and a transmitting a second status coding when battery condition is at an unacceptable working potential, and means for attaching said monitoring system to said exterior enclosure of said battery whereby the operating condition of said battery is always communicated to a remote optical receiving device.

* * * * *